(12) United States Patent
Yeo

(10) Patent No.: US 8,145,976 B1
(45) Date of Patent: Mar. 27, 2012

(54) ERROR CORRECTING

(75) Inventor: Engling Yeo, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 944 days.

(21) Appl. No.: 12/120,483

(22) Filed: May 14, 2008

Related U.S. Application Data

(60) Provisional application No. 60/917,812, filed on May 14, 2007.

(51) Int. Cl.
*H03M 13/00* (2006.01)

(52) U.S. Cl. ........................................ 714/758

(58) Field of Classification Search ............... 714/758
See application file for complete search history.

(56) References Cited

U.S. PATENT DOCUMENTS

| | | | |
|---|---|---|---|
| 4,789,994 | A | 12/1988 | Randall et al. |
| 5,909,384 | A | 6/1999 | Tal et al. |
| 6,170,042 | B1 | 1/2001 | Gaertner et al. |
| 6,292,856 | B1 | 9/2001 | Marcotte |
| 6,745,266 | B1 | 6/2004 | Johnson et al. |
| 6,745,303 | B2 | 6/2004 | Watanabe |
| 6,892,250 | B2 | 5/2005 | Hoskins |
| 6,925,539 | B2 | 8/2005 | Mowery et al. |
| 7,043,567 | B2 | 5/2006 | Trantham |
| 7,158,324 | B2 | 1/2007 | Stein et al. |
| 7,194,607 | B2 | 3/2007 | Dahlen et al. |
| 7,203,232 | B2 | 4/2007 | Ahn |
| 7,330,068 | B2 | 2/2008 | Barksdale |
| 7,421,614 | B2 | 9/2008 | Watanabe |
| 7,849,259 | B1 | 12/2010 | Wong et al. |
| 7,987,396 | B1 | 7/2011 | Riani et al. |
| 2006/0146926 | A1 | 7/2006 | Bhoja et al. |
| 2007/0101075 | A1 | 5/2007 | Jeddeloh |
| 2009/0135035 | A1 | 5/2009 | Fifield |

OTHER PUBLICATIONS

"Notice of Allowance", U.S. Appl. No. 12/556,483, filed Mar. 29, 2011, 6 pages.
"Notice of Allowance", U.S. Appl. No. 12/323,267, (Dec. 6, 2011), 6 pages.

*Primary Examiner* — Amine Riad

(57) ABSTRACT

In one or more embodiments, a method, computer-readable media, and/or computational unit acts or is capable of receiving, from a single, integrated memory, current and previous iterations of Log Likelihood Ratio ("LLR") parameters for a current iteration of a Low-Density Parity-Check code ("LDPC code") error-correcting process. These may then perform an LDPC code error-correcting algorithm using the current and previous iterations of LLR parameters. Following this, these embodiment(s) may overwrite the previous iteration of LLR parameters with a now-current iteration of LLR parameters and treat the current iteration of LLR parameters as a now-previous iteration of LLR parameters. Both of these iterations of LLR parameters for the now-current iteration may then be received following overwrite of the previous iteration of LLR parameters with the now-current iteration of LLR parameters. With these now-current and now-previous iterations of LLR parameters these embodiment(s) may perform the LDPC code error-correcting algorithm.

25 Claims, 5 Drawing Sheets

ERROR CORRECTING

RELATED APPLICATION

This application claims priority to U.S. Provisional Patent Application Ser. No. 60/917,812 filed May 14, 2007, entitled "LDPC Decoder Memory Optimization" to Engling Yeo, the disclosure of which is incorporated by reference herein in its entirety.

BACKGROUND

Some error-correcting algorithms, such as Low-Density Parity-Check code ("LDPC code"), permit higher data transmission rates than many other algorithms used today. LDPC code may even permit data transmission rates at close to the theoretical maximum, called the "Shannon Limit."

LDPC code, however, uses sets of parameters to perform its error correcting (e.g., Log Likelihood Ratio ("LLR") parameters). These sets of parameters are typically stored in separate sets of memory, either on a single, integrated chip or on separate chips. In either case, these sets of parameters may be read from and written to these sets of memory by a computational unit that performs the LDPC code's algorithm using a cache (e.g., a Static Random Access Memory, or SRAM).

To read and write these parameters to and from these sets of memory, current systems often use high-speed buses and high-speed transmission lines. These high-speed buses and high-speed transmission lines—even though they may be very fast—still slow the process of error correcting. This reduces the advantages of the LDPC code's algorithm because the computational unit and/or its cache has to wait on the buses and transmission lines to transmit the data.

SUMMARY

This Summary is provided to introduce a selection of concepts in a simplified form that are further described below in the Detailed Description. This Summary is not intended to identify key or essential features of the claimed subject matter, nor is it intended to be used as an aid in determining the scope of the claimed subject matter.

In one embodiment, a method is described comprising steps of: receiving, from a single, integrated memory, current and previous iterations of Log Likelihood Ratio ("LLR") parameters for a current iteration of a Low-Density Parity-Check code ("LDPC code") error-correcting process; performing an LDPC code error-correcting algorithm using the current and previous iterations of LLR parameters; overwriting the previous iteration of LLR parameters with a now-current iteration of LLR parameters and treating the current iteration of LLR parameters as a now-previous iteration of LLR parameters; after said overwriting, receiving both the now-current and the now-previous iterations of LLR parameters for the now-current iteration of the LDPC code error-correcting process from the single, integrated memory; and performing the LDPC code error-correcting algorithm using the now-current and the now-previous iterations of LLR parameters.

In another embodiment, one or more computer-readable media comprising computer-executable instructions are described that, when executed: receive from a single, integrated memory current and previous iterations of Log Likelihood Ratio ("LLR") parameters for a current iteration of a Low-Density Parity-Check code ("LDPC code") error-correcting process; perform an LDPC code error-correcting algorithm using the current and previous iterations of LLR parameters; overwrite the previous iteration of LLR parameters with a now-current iteration of LLR parameters and treat the current iteration of LLR parameters as a now-previous iteration of LLR parameters; after said overwrite, receive both the now-current and the now-previous iterations of LLR parameters for the now-current iteration of the LDPC code error-correcting process from the single, integrated memory; and perform the LDPC code error-correcting algorithm using the now-current and the now-previous iterations of LLR parameters. In still another embodiment, an integrated circuit capable of performing a Low-Density Parity-Check code ("LDPC code") error-correcting process is described that comprises: a single, integrated memory storing a current and a previous iteration of Log Likelihood Ratio ("LLR") parameters; and a computational unit capable of receiving from the single, integrated memory, the current and previous iterations of LLR parameters for a current iteration of the LDPC code error-correcting process; performing an LDPC code error-correcting algorithm using the current and previous iterations of LLR parameters; overwriting the previous iteration of LLR parameters with a now-current iteration of LLR parameters and treating the current iteration of LLR parameters as a now-previous iteration of LLR parameters; after said overwriting, receiving both the now-current and the now-previous iterations of LLR parameters for the now-current iteration of the LDPC code error-correcting process from the single, integrated memory; and performing the LDPC code error-correcting algorithm using the now-current and the now-previous iterations of LLR parameters.

BRIEF DESCRIPTION OF THE DRAWINGS

The Detailed Description is described with reference to the accompanying figures. In the figures, the left-most digit(s) of a reference number identifies the figure in which the reference number first appears. The use of the same reference numbers in different instances in the description and the figures may indicate similar or identical items.

DETAILED DESCRIPTION

Overview

Figure 1:
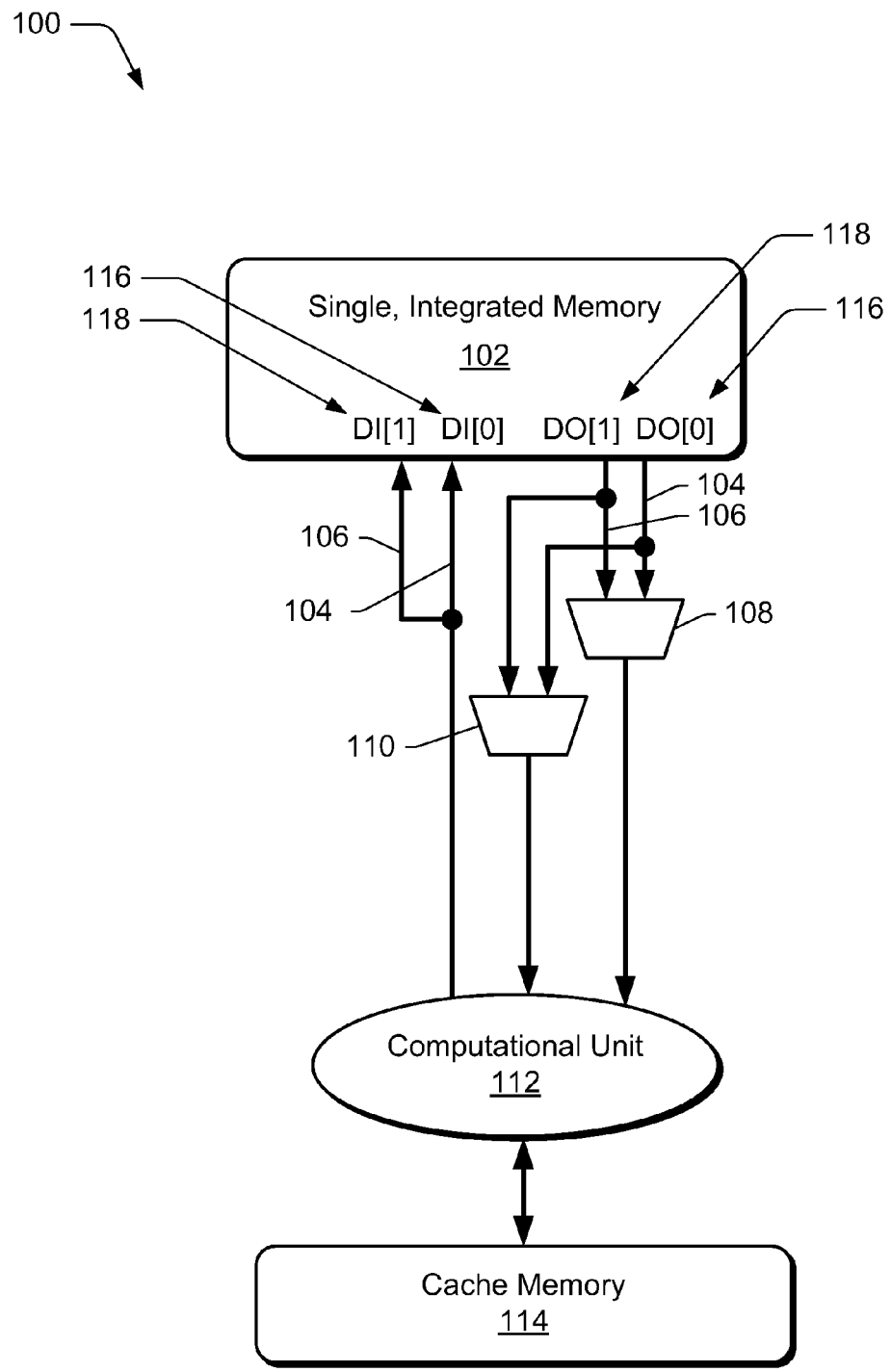
FIG. 1 is an illustration of an example operating environment that is configured to employ one or more error-correcting processes in accordance with one or more embodiments.

Error-correcting processes that use LDPC code algorithms ("LDPC processes") use sets of parameters to perform error correcting, such as LLR parameters. As part of their procedure, these LDPC processes may read and write LLR parameters for a current iteration and a previous iteration. Each set of LLR parameters, one set for each of the current and previous iteration, are typically stored in separate sets of memory. To read and write the LLR parameters, a computational unit relies on transmission lines and buses between the memories and the computational unit. As noted above, the speed at which the computational unit and the process overall may perform error correcting may be slowed by these transmission lines and buses.

The following document describes tools capable of speeding up error-correcting processes and/or reducing the cost and complexity of integrated circuits involved in these processes. The tools may include an integrated circuit having a single memory for storage of both sets of LLR parameters. This integrated circuit reduces the length of transmission connections and the complexity of the integrated circuit. The tools may also include techniques and processes by which these LLR parameters may be read and written to the single memory by a computational unit integrated into the circuit on which this single memory is placed.

Alternatively or additionally, the tools may also reduce manufacturing costs or complexity of integrated circuits on which memory is included that is intended for storage of LLR parameters. Thus, an integrated circuit having a computational unit and memory usable for and/or intended for error-correcting processes (e.g., LDPC code error correction procedures) may be made cheaper or simpler using the tools described herein.

In the discussion that follows, an example operating environment and integrated circuits are described that may incorporate or be used by the tools. Example procedures are also described that may be employed in the example operating environment and circuits, as well as others. In the discussion below reference will be made to the environment and circuits by way of example only. Therefore, implementation of the example procedures is not limited to the example environment or circuits. For example, the techniques described herein generally apply to LLR parameters or other types of parameters that are stored during an error correcting process. Types of error correcting processes include iterative error correcting processes such as turbo coding, LDPC coding, and the like. The term "tools" as used herein may refer to system(s), method(s), integrated circuit(s), memory architecture(s), various other hardware, computer-readable and/or executable instructions, and/or technique(s) as permitted by the context above and throughout the document.

Example Operating Environment

Before describing the tools in detail, the following discussion of an example operating environment is provided to assist the reader in understanding some ways in which various inventive aspects of the tools may be employed. The environment described below constitutes one example and is not intended to limit application of the tools to this or any particular operating environment. Other environments may be used without departing from the scope of the claimed subject matter.

FIG. 1 illustrates one such operating environment generally at 100. For ease in explanation and illustration, only a small number of some entities in the environment are shown, such as selective multiplexers and transmission connections. These connections provide communication, such as electrical or optical communication, and may include wires, lines, links, or optical fibers, to name a few. The example operating environment includes a single, integrated memory 102, a first set of transmission connections 104, a second set of transmission connections 106, one or more first selective multiplexers 108 (one shown), one or more second selective multiplexers 110 (one shown), a computational unit 112, and cache memory 114.

Single, integrated memory 102 has a first set of bit locations 116 and a second set of bit locations 118 (a few of many such locations shown for ease in illustration). The first set of bit locations 116 is capable of storing current or previous iterations of parameters or other data usable by an error-correcting procedure, such as a Low-Density Parity-Check code ("LDPC code") error correction procedure. In some embodiments these parameters or data include Log Likelihood Ratio ("LLR") parameters used by an LDPC error-correction procedure. Similarly, the second set of bit locations 118 are capable of storing the other of the current or previous iteration of parameters or other data, whichever of these are not being stored by the first set of bit locations. These bit locations are marked DO[1], DO[0], DI[1], and DI[0]. The DO stands for Data Out and the DI for Data In. The [1]s represent odd-numbered addresses for the bit locations. The [0]s represent even-numbered addresses for the bit locations. These addresses are examples only, as other configurations are contemplated herein and discussed below.

In keeping with this particular embodiment of even- and odd-numbered bit locations, the single, integrated memory is capable of accepting a bitmask pattern to permit overwrite of odd or even-numbered bit locations, which here are the second set of bit locations and the first set of bit locations, respectively. Thus, the connections of the first set of transmission connections alternate with the connections of the second set of transmission connections such that each connection of a superset of the connections combining both the first set of transmission connections and the second set of transmission connections alternate between bit locations of the first set of bit locations and bit locations of the second set of bit locations. As shown, each connection of one set abuts at least one connection of the other set. This arrangement, as well as others contemplated herein, permits relatively short transmission connections between bit locations having different iteration parameters and a multiplexer to which both bit locations are communicatively coupled through transmission connections. Other types of mask patterns and arrangements of bit locations are also contemplated.

The first set of transmission connections 104 communicatively couple the first set of bit locations to both first and second sets of selective multiplexers 108, 110. The second set of transmission connections 106 communicatively couple the second set of bit locations to both first and second sets of selective multiplexers 108, 110. Note that this arrangement of bit locations and transmission connections permit each selective multiplexer to have both transmission connections quite short. If one set of parameters were stored in one memory and another set were stored in another memory, each selective multiplexer would likely have at least one transmission connection (and possibly both) that was relatively long in comparison to that provided with the arrangement shown in FIG. 1.

Figure 2:
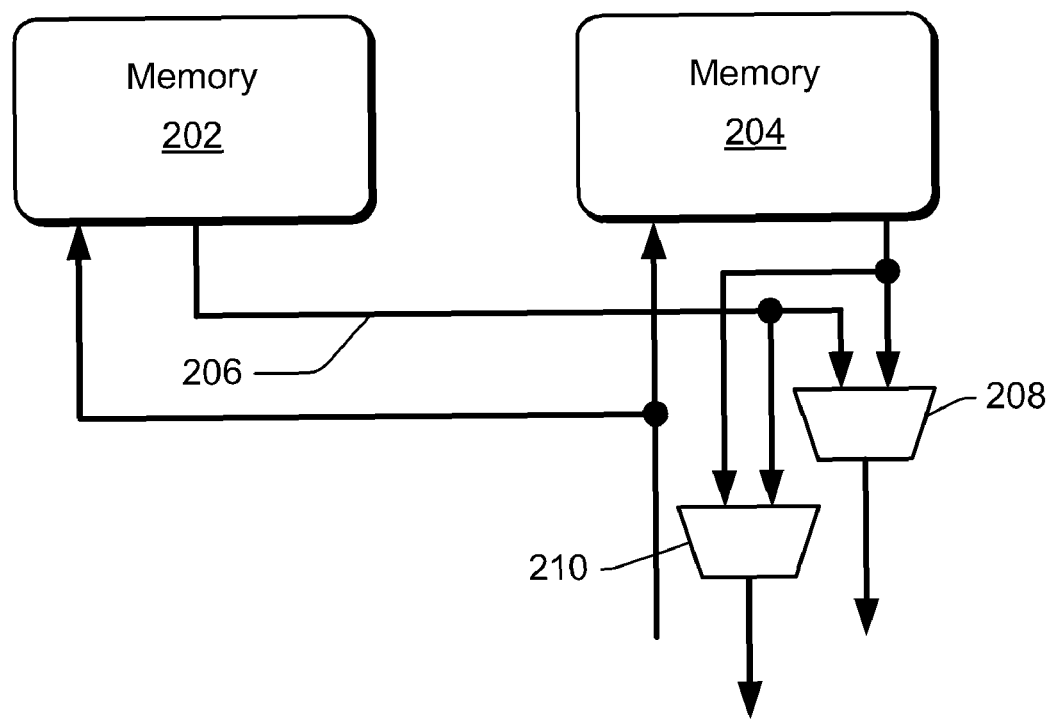
FIG. 2 is an illustration of two, non-integrated memories.

Consider, for example, FIG. 2, which illustrates two memories 202 and 204 that are not integrated (though they may be on the same integrated circuit, they are not a single memory). Transmission connection 206 is distant from selective multiplexers 208 and 210. Note that even if the selective multiplexers are placed more between or equally close to both memories, the transmission connections from both memories would likely be longer than were a single, integrated memory used (such as 102 of FIG. 1). As noted above, shorter transmission connections are often less expensive and permit faster throughput. A single, integrated memory is also often less complex and less expensive to manufacture than two, disparate memories.

Returning to FIG. 1, consider the first and second selective multiplexers 108, 110. As is apparent from the illustration, the first selective multiplexers 108 are communicatively coupled through the first set of transmission connections 104 to the first set of bit locations 116 and also to computational unit 112 through one or more other communication conduits. The first selective multiplexers are also communicatively coupled through the second set of transmission connections 106 to the second set of bit locations 118 and also to computational unit 112 through one or more other communication conduits.

Similarly, the second selective multiplexers 110 are communicatively coupled through the first set of transmission connections 104 to the first set of bit locations 116 and also to computational unit 112 through one or more other communication conduits. The second selective multiplexers are also communicatively coupled through the second set of transmission connections 106 to the second set of bit locations 118 and also to computational unit 112 through one or more other communication conduits.

These selective multiplexers 108, 110 are capable of receiving data from both sets of transmission connections (e.g., both current and previous iterations of LLR parameters) and providing only one of these sets to computational unit 112.

Computational unit 112 is capable of performing some or all of the computations involved in an error-correcting process, such as performing algorithms of the LDPC code error-correcting process noted above. In some of these processes the computational unit reads and writes information to and from cache memory 114. This cache memory is separate from the single, integrated memory and usable by the computational unit as an aid in performing various tasks and operations noted herein.

The computational unit may include hardware, software, firmware, or a combination thereof. If software, the computational unit may include one or more processors to execute computer-executable instructions stored on one or more computer-readable media (e.g., the cache memory). In hardware, the computational unit may include circuitry capable of performing the acts and operations set forth herein.

In one example embodiment, the computational unit receives both the current and the previous iterations of LLR parameters for a current iteration of an LDPC code error-correcting process from the first and second selective multiplexers and from the first and second sets of bit locations 116, 118 from the single, integrated memory 102.

Using these parameters, the computational unit performs an LDPC code error-correcting algorithm as part of an LDPC process. The computational unit may then overwrite whichever of the first or second set of bit locations are storing the previous iteration of LLR parameters with a now-current iteration of LLR parameters and treating the current iteration of LLR parameters as a now-previous iteration of LLR parameters. The LDPC process may continue with iteration after iteration. The computational unit thus may continue, receiving both the now-current and the now-previous iterations of LLR parameters for a now-current iteration of an LDPC code error-correcting process following an overwrite of the previous iteration of LLR parameters with the now-current iteration of LLR parameters. The process continues by performing the LDPC code error-correcting algorithm using the now-current and the now-previous iterations of LLR parameters.

The overwrite operations, at least in the above-described example embodiment, use a bitmask to overwrite whichever of the bit locations include parameters from the prior iteration, here either bit locations with a binary address ending either in one or zero.

Implementation Example

Figure 3:
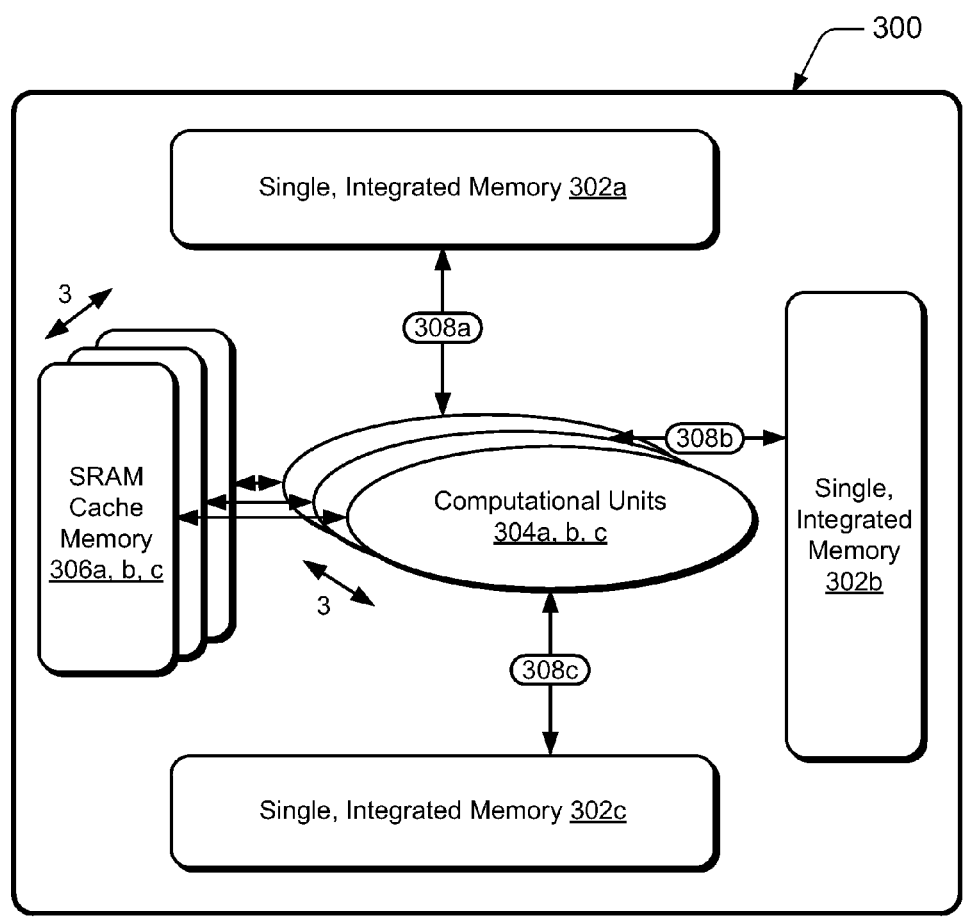
FIG. 3 is an illustration of an example implementation of an integrated circuit capable of performing an LDPC process in accordance with one or more embodiments.

FIG. 3 illustrates an example implementation of an integrated circuit 300 capable of performing LDPC processes and having particular hardware arrangements and orientations. The integrated circuit 300 may be incorporated within an integrated circuit package that is used by one or more computing devices to provide error-correcting. This implementation comprises three single, integrated memories 302*a*, 302*b*, and 302*c*, computational units 304*a*, 304*b*, and 304*c*, and SRAM cache memories 306*a*, 306*b*, and 306*c*, though quantities other than three of each of these are contemplated herein.

Conduits 308*a*, 308*b*, and 308*c* provide communication and various operations between each single, integrated memory and its respective computational units. These conduits comprise various multiplexers (such as selective multiplexers 108, 110 of FIG. 1), buses (not shown), and transmission connections.

Figure 4:
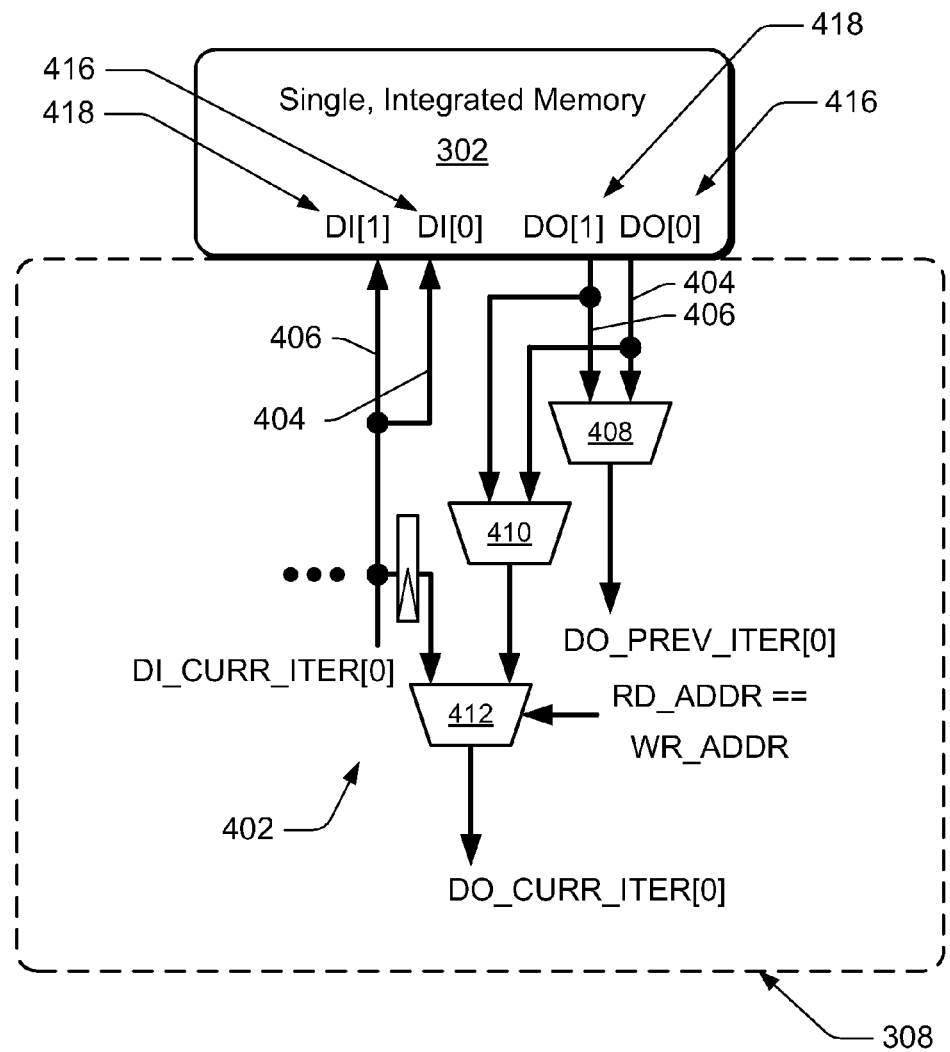
FIG. 4 is an illustration of an example implementation of a conduit and integrated memory of FIG. 3 in accordance with one or more embodiments.

FIG. 4 illustrates an example implementation of conduit 308 and integrated memory 302. This conduit comprises a feed forward unit 402, sets of transmission connections 404 and 406 similar to 104 and 106 of FIG. 1, as well as multiplexers 408 and 410, also similar to those of 108 and 110 of FIG. 1. Feed forward unit 402 is capable of determining that a read address and a write address for data is the same and, responsive to this determination, providing data having the write address to the computational unit (not shown) instead of data at a bit location equal to the read address. To aid in doing so, the feed forward unit comprises a selective multiplexer 412 communicatively positioned between the single, integrated memory and the computational unit and is capable of determining that the read address and the write address is or is not equal.

Note the text shown in FIG. 4, which illustrates where parameters from a previous iteration of an LDPC process are communicated to a computational unit, such as any of computational units 304 of FIG. 3 (shown at "DO_PREV_ITER [0]"), equivalence of read and write addresses (shown at "RD_ADDR==WR_ADDR"), where parameters of a current iteration are written (shown at "DI_CURR_ITER[0]"), and where parameters of a current iteration are communicated to the computational unit (shown at "DO_CURR_ITER[0]"). The feed forward unit may enable a computational unit to receive parameters (when the read and write address are equal) more quickly than may be permitted if the parameters are instead read from the memory.

Example Procedure

The following discussion describes techniques that may be implemented utilizing the previously described systems, devices, and circuits as well as others. Aspects of the procedure may be implemented in hardware, firmware, or software, or a combination thereof. The procedure is shown as a set of blocks that specify operations performed by one or more entities and are not necessarily limited to the orders shown for performing the operations by the respective blocks.

Figure 5:
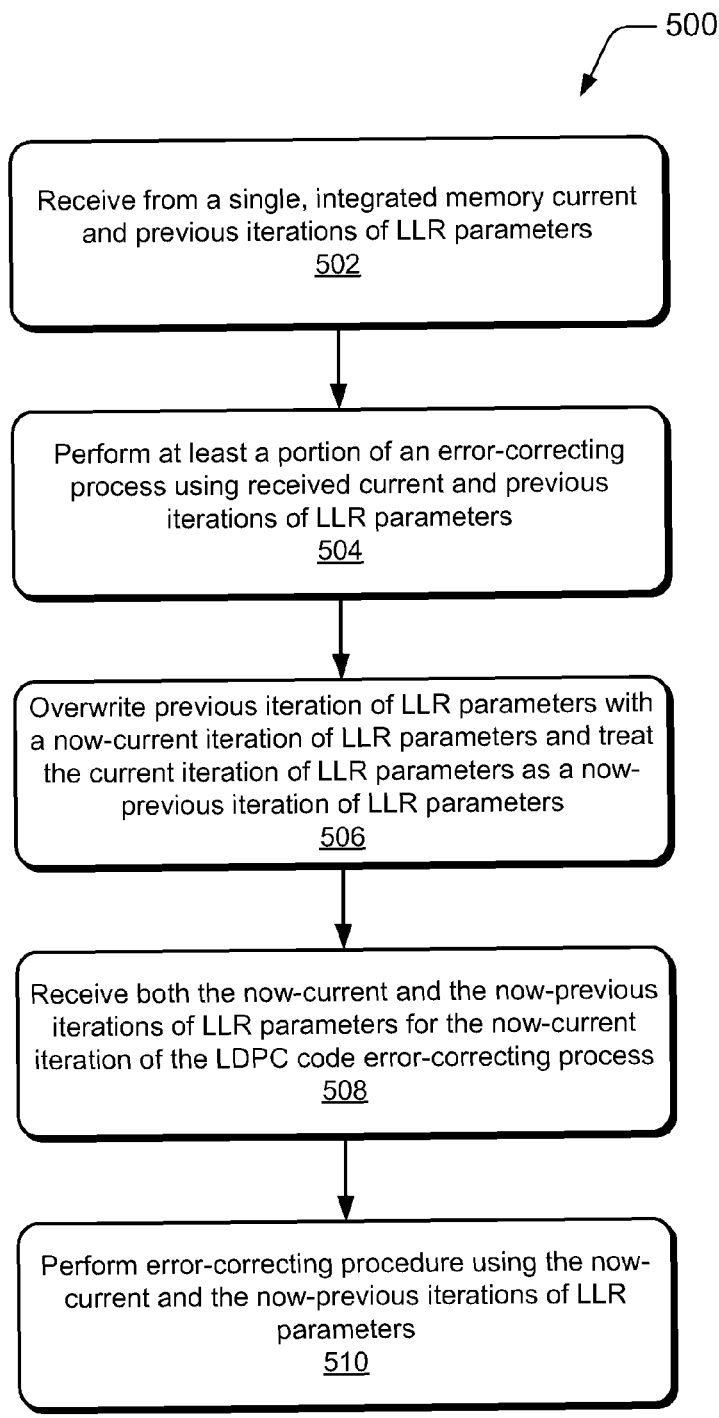
FIG. 5 is a flow diagram that depicts an example procedure that may be used to increase the speed at which an error-correcting process may be performed in accordance with one or more embodiments.

FIG. 5 depicts a procedure 500 in an example implementation in which the example operating environment 100 of FIG. 1 and/or integrated circuit 300 of FIG. 3 may be used to increase the speed at which an error-correcting process is performed. In one embodiment, the tools enable an LDPC error-correcting process to be performed faster by using a device having short transmission connections between memory in which parameters used by the LDPC code are stored and an entity capable of using those parameters to perform LDPC code or other error-correcting process.

Block 502 receives from a single, integrated memory current and previous iterations of LLR parameters for a current iteration of an LDPC code error-correcting process. The current and previous iterations of LLR parameters may be received from various locations in the single, integrated memory, even including a current iteration's parameters from one compartmentalized section (e.g., a "left or top half" of a memory) and the prior iteration's parameter's from another compartmentalized section (e.g., the "right or bottom half" of the same memory). While this may shorten the transmission connections compared to two, disparate memories (e.g., those shown in FIG. 2), having the current and previous parameters intermeshed enables even shorter transmission connections. Some above examples have the intermeshing at a high level where each bit location abuts another bit location having data for the other of the current or previous iteration. Other intermeshing may also be used, such as having some set of bit locations for the current or previous parameters and some set of bit locations for the other of the current or previous parameters, such as having alternating 10-bit locations. In this case the performance of the single, integrated memory and the tools more generally may still be an improvement and/or enabled cheaper than techniques currently used in the art.

Using an above-noted implementation, the tools may act at block 502 to receive the current and previous iterations from bit locations, at least some of which have addresses overlapping other addresses of bit locations from which the previous iteration of LLR parameters are received.

Block 504 performs at least a portion of an error-correcting process using current and previous iterations of LLR parameters. For example, the tools may perform the above-noted LDPC code error-correcting algorithm as part of this process.

Block 506 overwrites the previous iteration of LLR parameters with a now-current iteration of LLR parameters and treats the current iteration of LLR parameters as a now-previous iteration of LLR parameters. The tools may overwrite selectively using a bitmask, such as any of the bitmasks contemplated above. In some examples the tools use a bitmask permitting overwrite of only odd or even bit locations in a single, integrated memory as noted above.

Block 508 receives both the now-current and the now-previous iterations of LLR parameters for the now-current iteration of the LDPC code error-correcting process following overwrite of the previous iteration of LLR parameters with the now-current iteration of LLR parameters. These now-current and now-previous iterations of LLR parameters may be received from the same bit locations from which the act of receiving the current and previous iterations of LLR parameters received the previous iteration of LLR parameters.

Block 510 performs the error-correcting procedure or some portion of it, such as an LDPC code error-correcting algorithm, using the now-current and the now-previous iterations of LLR parameters.

CONCLUSION

The tools described herein are capable, in some embodiments, of speeding up error-correcting processes and/or reducing the cost and complexity of integrated circuits involved in these processes. Although the subject matter has been described in language specific to structural features and/or methodological acts, the subject matter defined in the appended claims is not necessarily limited to the specific features or acts described above. Rather, the specific features and acts described above are disclosed as example forms of implementing the claims.

What is claimed is:

1. A method comprising:
receiving from a single, integrated memory, current and previous iterations of Log Likelihood Ratio ("LLR") parameters for a current iteration of a Low-Density Parity-Check code ("LDPC code") error-correcting process;
performing an LDPC code error-correcting algorithm using the current and previous iterations of LLR parameters;
overwriting the previous iteration of LLR parameters with a now-current iteration of LLR parameters and treating the current iteration of LLR parameters as a now-previous iteration of LLR parameters;
after overwriting the previous iteration of LLR parameters, receiving both the now-current and the now-previous iterations of LLR parameters for the now-current iteration of the LDPC code error-correcting process from the single, integrated memory; and
performing the LDPC code error-correcting algorithm using the now-current and the now-previous iterations of LLR parameters.

2. The method of claim 1, wherein receiving the current and previous iterations of LLR parameters includes receiving the current iteration of LLR parameters from bit locations at least some of which have addresses intermeshed with addresses of bit locations from which the previous iteration of LLR parameters are received.

3. The method of claim 1, wherein overwriting the previous iteration of LLR parameters include overwriting the previous iteration of LLR parameters with the now-current iteration of LLR parameters using a bitmask.

4. The method of claim 3, wherein the bitmask permits overwriting of only odd or only even bit locations of the single, integrated memory.

5. The method of claim 1, wherein receiving both the now-current and the now-previous iterations of LLR parameters includes receiving the now-current iteration of LLR parameters from same bit locations from which the current and previous iterations of LLR parameters were previously received.

6. The method of claim 5, wherein the same bit locations from which the previous iteration of LLR parameters where received for the current iteration of the LDPC code process and the now-current iteration of LLR parameters are received for the now-current iteration of the LDPC code process are all even-numbered or are all odd-numbered bit locations of the single, integrated memory.

7. One or more computer-readable media comprising computer-executable instructions that, when executed:
receive from a single, integrated memory current and previous iterations of Log Likelihood Ratio ("LLR") parameters for a current iteration of a Low-Density Parity-Check code ("LDPC code") error-correcting process;
perform an LDPC code error-correcting algorithm using the current and previous iterations of LLR parameters;
overwrite the previous iteration of LLR parameters with a now-current iteration of LLR parameters and treat the current iteration of LLR parameters as a now-previous iteration of LLR parameters;
after overwrite of the previous iteration of LLR parameters, receive both the now-current and the now-previous iterations of LLR parameters for the now-current iteration of the LDPC code error-correcting process from the single, integrated memory; and perform the LDPC code error-correcting algorithm using the now-current and the now-previous iterations of LLR parameters.

8. The media of claim 7, wherein the instructions to receive the current and previous iterations of LLR parameters include instructions to receive the current iteration of LLR parameters from bit locations at least of some of which have addresses intermeshed with addresses of bit locations from which the previous iteration of LLR parameters are received.

9. The media of claim 7, wherein the instructions to overwrite the previous iteration of LLR parameters include instructions to overwrite the previous iteration of LLR parameters with the now-current iteration of LLR parameters using a bitmask.

10. The media of claim 9, wherein the bitmask permits overwrite of only odd or only even bit locations of the single, integrated memory.

11. The media of claim 7, wherein the instructions to receive both the now-current and the now-previous iterations of LLR parameters include instructions to receive the now-current iteration of LLR parameters from same bit locations from which the current and previous iterations of LLR parameters were previously received.

12. The media of claim 11, wherein the same bit locations from which the previous iteration of LLR parameters where received for the current iteration of the LDPC code process and the now-current iteration of LLR parameters are received for the now-current iteration of the LDPC code process are all even-numbered or are all odd-numbered bit locations of the single, integrated memory.

13. An integrated circuit capable of performing a Low-Density Parity-Check code ("LDPC code") error-correcting process, the integrated circuit comprising:
a single, integrated memory storing a current and a previous iteration of Log Likelihood Ratio ("LLR") parameters; and
a computational unit capable of:
receiving from the single, integrated memory, the current and previous iterations of LLR parameters for a current iteration of the LDPC code error-correcting process;
performing an LDPC code error-correcting algorithm using the current and previous iterations of LLR parameters;
overwriting the previous iteration of LLR parameters with a now-current iteration of LLR parameters and treating the current iteration of LLR parameters as a now-previous iteration of LLR parameters;
after overwriting the previous iteration of LLR parameters, receiving both the now-current and the now-previous iterations of LLR parameters for the now-current iteration of the LDPC code error-correcting process from the single, integrated memory; and
performing the LDPC code error-correcting algorithm using the now-current and the now-previous iterations of LLR parameters.

14. The integrated circuit of claim 13, wherein the integrated circuit comprises a memory cache separate from the single, integrated memory and usable by the computational unit in its capability of: performing the LDPC code error-correcting algorithm using the current and previous iterations of LLR parameters; overwriting; or performing the LDPC code error-correcting algorithm using the now-current and the current iterations of LLR parameters.

15. The integrated circuit of claim 13, wherein the single, integrated memory has a first set of bit locations capable of storing the current or the previous iteration of LLR parameters and a second set of bit locations capable of storing the other of the current or the previous iteration of LLR parameters and is capable of accepting a bitmask pattern to permit alternating overwrite of the first set of bit locations and the second set of bit locations and wherein the capability of the computational unit to perform the act of overwriting overwrites with the bitmask pattern.

16. The integrated circuit of claim 15, wherein the bitmask pattern permits alternating overwrite of bit locations ending in a binary address of one and bit locations ending in a binary address of zero.

17. The integrated circuit of claim 13, wherein the single, integrated memory has a first set of bit locations capable of storing the current or the previous iteration of LLR parameters and a second set of bit locations capable of storing the other of the current or the previous iteration of LLR parameters and further comprising:
a first set of transmission connections;
a second set of transmission connections;
one or more first selective multiplexers; and
one or more second selective multiplexers, wherein:
the first set of transmission connections are communicatively coupled to the first set of bit locations;
the second set of transmission connections are communicatively coupled to the second set of bit locations;
the one or more first selective multiplexers are communicatively coupled through one or more connections of the first set of transmission connections to the first set of bit locations and also communicatively coupled through one or more connections of the second set of transmission connections to the second set of bit locations, the one or more first selective multiplexers capable of providing the current or the previous iteration of LLR parameters to the computational unit; and
the one or more second selective multiplexers communicatively coupled through one or more connections of the first set of transmission connections to the first set of bit locations and also communicatively coupled through one or more connections of the second set of transmission connections to the second set of bit locations, the one or more second selective multiplexers capable of providing the other of the current or the previous iteration of LLR parameters to the computational unit.

18. The integrated circuit of claim 17, wherein the connections of the first set of transmission connections alternate with the connections of the second set of transmission connections such that each connection of a superset of the connections combining both the first set of transmission connections and the second set of transmission connections alternate between bit locations of the first set of bit locations and bit locations of the second set of bit locations.

19. The integrated circuit of claim 17, wherein each bit location of the first set of bit locations abuts at least one bit location of the second set of bit locations.

20. The integrated circuit of claim 13, further comprising a feed-forward unit capable of determining that a read address for first data of the current or previous iteration of LLR parameters and a write address for second data of the current or previous iteration of LLR parameters are the same and, responsive to this determination, providing the second data to the computational unit instead of the first data.

21. The integrated circuit of claim 20, wherein the feed-forward unit comprises:
a selective multiplexer communicatively positioned between the single, integrated memory and the computational unit and capable of determining that the read address and the write address is or is not equal.

22. The integrated circuit of claim 13, wherein the computational unit's capability of receiving the current and previous iterations of LLR parameters receives the current iteration of LLR parameters from bit locations at least some of which have addresses intermeshed with addresses of bit locations from which the previous iteration of LLR parameters are received.

23. The integrated circuit of claim 13, wherein the computational unit's capability of overwriting overwrites the previous iteration of LLR parameters with the now-current iteration of LLR parameters using a bitmask that permits overwriting of only odd or only even bit locations of the single, integrated memory.

24. The integrated circuit of claim 13, wherein the computational unit's capability of receiving both the now-current and the now-previous iterations of LLR parameters receives the now-current iteration of LLR parameters from same bit locations from which the act of receiving the current and previous iterations of LLR parameters received the previous iteration of LLR parameters.

25. The integrated circuit of claim 24, wherein the same bit locations from which the previous iteration of LLR parameters where received for the current iteration of the LDPC code process and the now-current iteration of LLR parameters are received for the now-current iteration of the LDPC code process are all even-numbered or are all odd-numbered bit locations of the single, integrated memory.

* * * * *